United States Patent
Hoshino

(10) Patent No.: US 9,348,235 B2
(45) Date of Patent: May 24, 2016

(54) EXPOSURE APPARATUS AND METHOD OF MANUFACTURING DEVICE

(71) Applicant: CANON KABUSHIKI KAISHA, Tokyo (JP)

(72) Inventor: Tomohiro Hoshino, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/453,944

(22) Filed: Aug. 7, 2014

(65) Prior Publication Data

US 2015/0049315 A1 Feb. 19, 2015

(30) Foreign Application Priority Data

Aug. 13, 2013 (JP) .................. 2013-168336

(51) Int. Cl.
- *G03B 27/68* (2006.01)
- *G03B 27/42* (2006.01)
- *G03F 7/20* (2006.01)

(52) U.S. Cl.
CPC ........ *G03F 7/70483* (2013.01); *G03F 7/70308* (2013.01)

(58) Field of Classification Search
CPC .............................. G03F 7/70308; G03F 7/20
USPC ......................... 355/52, 53, 55, 67
See application file for complete search history.

(56) References Cited

U.S. PATENT DOCUMENTS

| 6,563,564 B2* | 5/2003 | de Mol et al. ................ 355/52 |
| 2002/0036758 A1 | 3/2002 | De Mol et al. |
| 2002/0039845 A1* | 4/2002 | Yoshimura .................. 438/784 |
| 2009/0028421 A1* | 1/2009 | Sukegawa .................. 382/144 |
| 2013/0137050 A1* | 5/2013 | Takahashi et al. ............ 430/325 |

FOREIGN PATENT DOCUMENTS

| JP | 63-016725 B2 | 4/1988 |
| JP | 2002-015997 A | 1/2002 |

* cited by examiner

*Primary Examiner* — Hung Henry Nguyen
(74) *Attorney, Agent, or Firm* — Rossi, Kimms & McDowell LLP

(57) ABSTRACT

An exposure apparatus projects an image of a pattern formed on a mask onto a substrate through a projection optical system. The exposure apparatus includes: a prediction unit configured to predict an imaging characteristic fluctuation of the projection optical system which is caused by thermal action due to exposure, by using a model formula modeling the imaging characteristic fluctuation; and a correction unit configured to correct the imaging characteristic based on a prediction result obtained by the prediction unit. The model formula includes a composition of a plurality of functions modeling the imaging characteristic fluctuation and indicating a time dependency, each of the plurality of functions having an exposure-angle-of-view dependency and the exposure-angle-of-view dependencies of the plurality of functions being different from each other.

6 Claims, 4 Drawing Sheets

F I G. 1
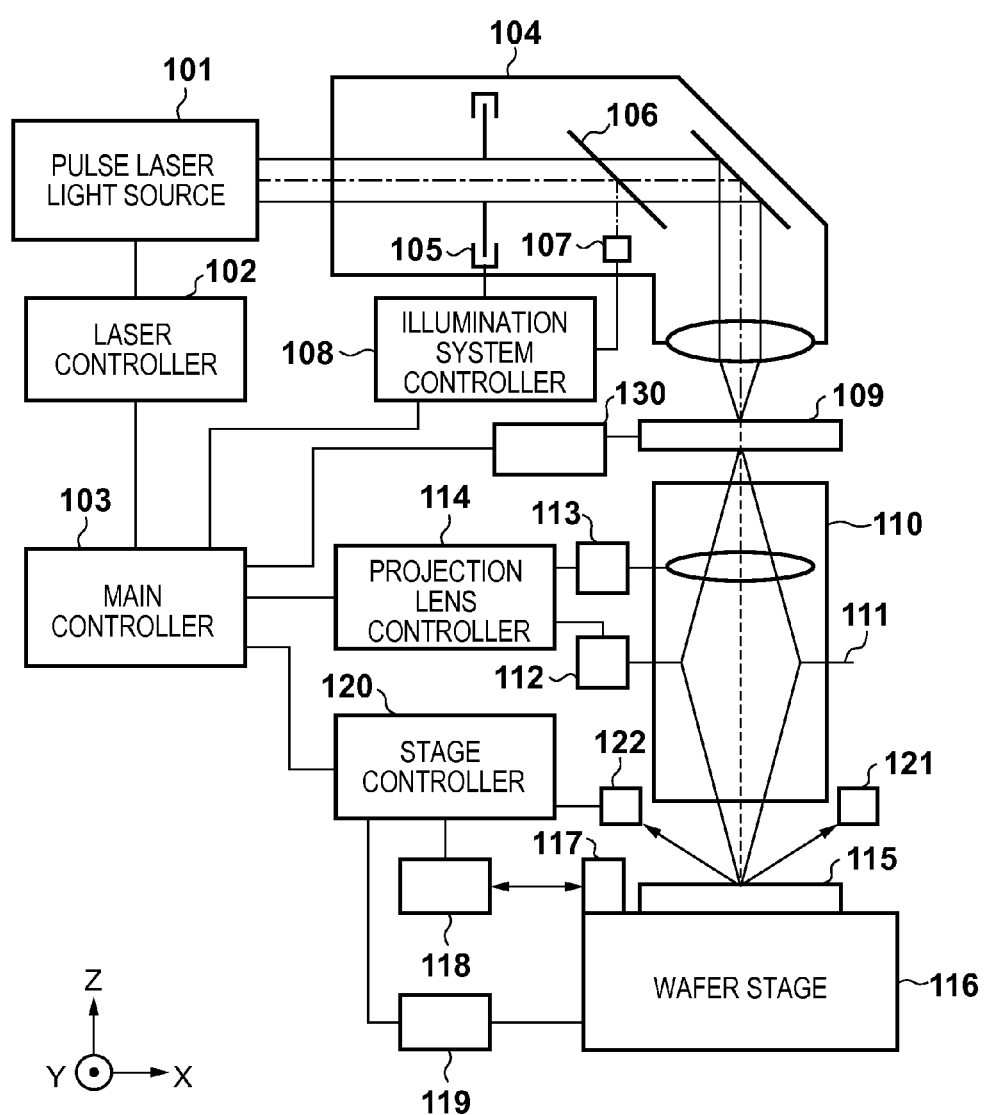

EXPOSURE APPARATUS AND METHOD OF MANUFACTURING DEVICE

BACKGROUND OF THE INVENTION

1. Field of the Invention

The present invention relates to an exposure apparatus and a method of manufacturing a device.

2. Description of the Related Art

In a manufacturing process for a semiconductor device formed from an ultrafine pattern, such as an LSI and a VSLI, a reduction projection exposure apparatus is used, which performs reduction exposure of a circuit pattern drawn on a mask (reticle) onto a substrate (wafer) coated with a photosensitive agent to form a print pattern. With an increase in the packaging density of semiconductor devices, demands have arisen for further micropatterning. Along with the development of a resist process, exposure apparatuses have been increasingly required to cope with micropatterning.

As a means for increasing the resolving power of an exposure apparatus, there are available a method of changing an exposure wavelength to a shorter wavelength and a method of increasing the NA (Numerical Aperture) of a projection optical system. As the resolving power increases, the focal depth of the projection optical system decreases. It is therefore an important theme to improve the focus accuracy of matching the imaging plane (focal plane) of the projection optical system with a wafer surface.

In addition, one of the important optical characteristics of the projection exposure apparatus is the alignment accuracy of accurately superimposing the respective patterns throughout, a plurality of steps. Important factors that influence this alignment accuracy include a magnification error in the projection optical system. As the size of a pattern used for a VLSI has tended to decrease year by year, there have been increasing needs for an improvement in alignment accuracy. It is therefore very important to keep the magnification of the projection optical system at a predetermined value.

The projection optical system absorbs part of exposure energy. It is known that the temperature of the projection optical system changes due to the heat generated by the absorption, and the optical characteristics of the projection optical system, such as the refractive exponent, change. If the projection optical system is kept irradiated with exposure light for a long time, imaging characteristics of the projection optical system (for example, a focus, curvature of field, magnification, distortion, astigmatism aberration, and wavefront aberration) fluctuate. As a result, a line width error, alignment error, and the like may occur by an amount which cannot be neglected in terms of the device manufacture.

For this reason, there has been proposed a method of compensating for imaging characteristic fluctuations depending on the irradiated state of exposure energy onto the projection optical system. For example, according to Japanese Patent Publication No. 63-16725, the amount of fluctuation in imaging characteristic depending on the exposure energy state of a projection optical system is computed by a model formula using an exposure amount, an exposure time, a non-exposure time, and the like as variables, and the imaging characteristic fluctuation of the projection optical system is corrected based on the computation result. The above model formula has a coefficient unique to the projection optical system for each imaging characteristic. Properly setting this coefficient can obtain and correct the imaging characteristic fluctuation of the projection optical system.

In addition, there has been proposed an exposure apparatus which can obtain a higher resolving power with respect to the projection of a specific pattern by changing an illumination shape. In such an apparatus, the light source distribution generated on the pupil plane of a projection optical system changes depending on exposure conditions (for example, a projection system NA, the numerical aperture of an illumination system, an exposure area, an exposure center position, and a mask used for exposure), and hence the amounts of fluctuation in imaging characteristics occurring for the respective exposure conditions differ from each other.

Therefore, in order to accurately correct fluctuations in imaging characteristics depending on the above light source distribution state of illumination light, it is necessary to calculate correction coefficients optimal for exposure conditions from differences in the light source distribution state of illumination light on the pupil plane, reticle transmittance, exposure area, scanning speed, exposure amount, irradiation time, and the like.

However, correction coefficients differ for the respective exposure conditions, and it requires much time to grasp a thermal fluctuation phenomenon accompanying exposure. Japanese Patent Laid-Open No. 2002-15997 discloses a method of predicting the imaging characteristic fluctuation caused by lens heating, by using, for example, the following model formula:

$$F(t)=A_1(1-e^{-t/\tau 1})+A_2(1-e^{-t/\tau 2}) \quad (1)$$

where $\tau_1$ and $\tau_2$ are time constants, and $A_1$ and $A_2$ are amplitudes.

In addition, the amplitudes $A_1$ and $A_2$ are expressed as follows, assuming linear dependencies on some of the parameters indicating the amplitudes, especially parameters proportional to power entering a lens, such as a light intensity, the size of an imaging plane, a reticle transmittance, and a wafer reflectance.

$$A_1=\mu_1 \cdot Tr \cdot S \cdot I \cdot W_{refl} \quad (2)$$

$$A_2=\mu_2 \cdot Tr \cdot S \cdot I \cdot W_{refl} \quad (3)$$

where I is an exposure intensity (W/m$^2$), S is the size of an imaging plane at the wafer level or a mask area (m$^2$), Tr is a reticle transmittance (a pure fraction or percentage), $W_{refl}$ is a wafer reflectance (a pure fraction or percentage), and $\mu_1$ and $\mu_2$ are correction coefficients. As described above, as a model formula for predicting an imaging characteristic fluctuation, a model formula is known to be obtained by modeling assuming a linear dependency on a parameter proportional to power entering the lens.

However, as in the case of the model formula described above, if the dependencies of the amplitudes $A_1$ and $A_2$ on an exposure angle of view are assumed in a linear form in the same manner, it is not possible to properly predict an imaging characteristic in a time zone immediately after the activation of the apparatus or a change in exposure condition, in which a fluctuation is relatively large.

In consideration of the above point, the present invention provides an exposure technique capable of predicting a change in imaging characteristic of the projection optical system upon a change in exposure angle of view and correcting the imaging characteristic.

SUMMARY OF THE INVENTION

According to one aspect of the present invention, there is provided an exposure apparatus which projects an image of a pattern formed on a mask onto a substrate through a projection optical system, the apparatus comprising: a prediction unit configured to predict an imaging characteristic fluctuation of the projection optical system which is caused by thermal action due to exposure, by using a model formula modeling the imaging characteristic fluctuation; and a correction unit configured to correct the imaging characteristic based on a prediction result obtained by the prediction unit, wherein the model formula comprises a composition of a plurality of functions modeling the imaging characteristic fluctuation and indicating a time dependency, each of the plurality of functions having an exposure-angle-of-view dependency and the exposure-angle-of-view dependencies of the plurality of functions being different from each other.

According to the present invention, it is possible to predict an imaging characteristic fluctuation of a projection optical system even upon a change in exposure angle of view and correct the imaging characteristic. It is possible to properly predict an imaging characteristic fluctuation and correct the imaging characteristic even upon a change in energy distribution entering a projection optical system upon a change in exposure angle of view.

Further features of the present invention will become apparent from the following description of exemplary embodiments (with reference to the attached drawings).

BRIEF DESCRIPTION OF THE DRAWINGS

FIG. 1 is a block diagram showing the arrangement of an exposure apparatus according to an embodiment;

DESCRIPTION OF THE EMBODIMENTS

Figure 2:
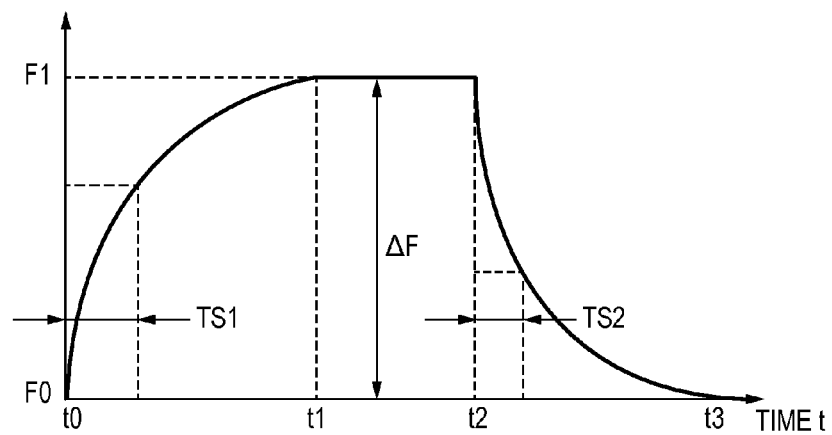
FIG. 2 is a graph showing an example of the aberration fluctuation characteristic of a projection optical system.

Embodiments of the present invention will be described in detail below with reference to the accompanying drawings. Note that the constituent elements described in the embodiments are merely examples. The technical scope of the present invention is determined by the scope of claims and is not limited by the following individual embodiments.

Assume that in this specification, an imaging characteristic includes at least one of a focus, curvature of field, magnification, distortion, astigmatism aberration, spherical aberration, coma aberration, and wavefront aberration. As is known in this technical field, a wavefront aberration is expressed as each term obtained when a wavefront shape is expanded using Zernike polynomials. In addition, they are sometimes collectively referred to as "aberrations".

First Embodiment

FIG. 1 is a block diagram showing the schematic arrangement of a scanning exposure apparatus (to be also simply referred to as an exposure apparatus hereinafter) according to this embodiment. The exposure apparatus projects a pattern formed on a mask onto a substrate via a projection optical system. Referring to FIG. 1, a pulse laser light source 101 is sealed with a gas such as KrF or ArF and emits laser light. The pulse laser light source 101 emits, for example, 193-nm light in the far-ultraviolet region. The pulse laser light source 101 includes a front mirror forming a resonator, a diffraction grating for narrowbanding an exposure wavelength, and a narrowbanding module formed from a prism and the like. In addition, the pulse laser light source 101 includes a monitor module which is formed from a spectroscope, a detector, and the like and monitors wavelength stability and a spectral width. Furthermore, the pulse laser light source 101 is provided with a shutter and the like.

A laser controller 102 and a main controller 103 of the overall exposure apparatus perform gas exchange control of the pulse laser light source 101, control for wavelength stability, control of an applied discharge voltage, and the like. In this embodiment, the laser controller 102 controls the pulse laser light source 101 in accordance with an instruction from the main controller 103 of the overall exposure apparatus instead of performing independent control alone.

The beam emitted from the pulse laser light source 101 is shaped into a predetermined beam shape via the beam shaping optical system (not shown) of an illumination optical system 104. The shaped beam further enters an optical integrator (not shown) to form many secondary light sources for illuminating a reticle 109 (to be described later) with a uniform illuminance distribution.

The aperture portion of an aperture stop 105 of the illumination optical system 104 has an almost circular shape. An illumination system controller 108 can set the diameter of the aperture portion, and then the NA (Numerical Aperture) of the illumination optical system 104 to desired values. In this case, since the value of the ratio between the numerical aperture of the recording medium 110 (to be described later) and the numerical aperture of the illumination optical system 104 is a coherence factor (σ value), the illumination system controller 108 can set a σ value by controlling the aperture stop 105 of the illumination system.

A half mirror 106 is arranged on the optical path of the illumination optical system 104. Part of exposure light illuminating the reticle 109 is reflected by the half mirror 106 to be extracted. A photosensor 107 for ultraviolet light is arranged on the optical path of reflected light from the half mirror 106 to generate an output corresponding to the intensity of exposure light (exposure energy). An integration circuit (not shown) which performs integration for each pulse emission by the pulse laser light source 101 converts an output from the photosensor 107 into exposure energy per pulse, and inputs it to the main controller 103 which controls the exposure apparatus main body via the illumination system controller 108.

The reticle (or mask) 109 is used as an original. A circuit pattern of a semiconductor device which is to be printed is formed on the reticle 109, and is irradiated with light by the illumination optical system 104. A projection optical system 110 is arranged to reduce a circuit pattern image on the reticle 109 at a reduction magnification β (for example, β=¼) and focus/project the image on one shot area on a wafer 115 as a photosensitive substrate coated with a photoresist. The reticle 109 is held on a reticle stage (mask stage) (not shown) which holds a reticle (mask). A reticle stage controller 130 (mask stage control unit) can control the position and posture (angle) of the reticle 109 by driving the reticle stage.

An aperture stop 111 of the projection optical system 110 which has an almost circular aperture portion is arranged on the pupil plane (the Fourier transform plane for a reticle) of the projection optical system 110. A driving unit 112 such as a motor can set the aperture diameter to a desired value by controlling the diameter of the aperture portion.

A field lens driving device 113 (driving unit) moves a field forming part of a lens system (optical element) in the projection optical system 110 on the optical axis of the projection optical system 110 by using an air pressure, piezoelectric element, or the like. This reduces a distortion error by optimizing the projection magnification while preventing the influences of various aberrations of the projection optical system 110.

A projection lens controller 114 controls the driving unit 112 and the field lens driving device 113 (driving unit) under the control of the main controller 103.

A wafer stage 116 (substrate stage) which holds a wafer can move in the three-dimensional directions, and can move in the optical axis direction (Z direction) of the projection optical system 110 and within a plane (X-Y plane) perpendicular to the optical axis direction. A laser interferometer 118 measures the distance from a moving mirror 117 fixed on the wafer stage 116 to detect the X-Y plane position of the wafer stage 116. A stage controller 120 (substrate stage control unit) can control the position or posture (angle) of the wafer 115 by driving the wafer stage 116.

The stage controller 120 under the control of the main controller 103 of the exposure apparatus detects the position of the wafer stage 116 by using the laser interferometer 118, and controls a driving unit 119 such as a motor to move the wafer stage 116 to a position within a predetermined X-Y plane.

In addition, a projection optical system 121 and a detection optical system 122 constitute a focus plane detection unit. The projection optical system 121 projects a plurality of light beams formed from non-exposure light which does not expose the photoresist on the wafer 115. Each light beam is focused on the wafer 115 and reflected. Each light beam reflected by the wafer 115 enters the detection optical system 122.

In the detection optical system 122, a plurality of position detection light-receiving elements (not shown) are arranged in correspondence with the respective reflected light beams, and the light-receiving surface of each position detection light-receiving element, is almost conjugated to the reflection point of each light beam on the wafer 115 by an imaging optical system. The positional shift of the wafer 115 surface in the optical axis direction of the projection optical system 110 is measured as the positional shift of an incident light beam on the corresponding position detection light-receiving element in the detection optical system 122.

The following will describe a model formula for the aberration fluctuation (imaging characteristic fluctuation) of the projection optical system 110 due to the irradiation of exposure energy and correction coefficients for compensating for an imaging characteristic fluctuation for each exposure condition, which are used to quantify the model formula according to this embodiment.

FIG. 2 shows an example of a secular change in aberration of the projection optical system 110 which is caused by exposure. The abscissa represents time t, and the ordinate, an aberration amount F of the projection optical system 110 at a given image height. Aberrations in this case include, for example, a focus, curvature of field, magnification, distortion aberration, astigmatism aberration, spherical aberration, and coma aberration. In addition, an aberration fluctuation amount ΔF generally takes different values at the respective image heights. Letting F0 be the initial value of an aberration amount as an imaging characteristic value of the projection optical system 110, when the projection optical system 110 starts exposure by using the pulse laser light source 101 at time t0, the aberration fluctuates with time and stabilizes to a predetermined aberration amount F1 at time t1. Subsequently, even if exposure light is kept applied to the projection optical system 110, the energy absorbed by the projection optical system 110 to generate heat and the heat energy emitted by the projection optical system 110 reach an equilibrium state, and the aberration amount does not change from F1. When the exposure stops at time t2, the aberration amount returns to the initial value with time. At time t3, the aberration amount becomes the initial aberration amount F0.

Time constant TS1 and TS2 in FIG. 2 are equivalent to time constants in the heat transfer characteristic of the projection optical system 110. These time constants and the maximum fluctuation amount F1 are values unique to the projection optical system 110, and differ for each aberration. Therefore, such values need to be determined for each apparatus and each aberration.

However, it requires a predetermined time or more to grasp a thermal fluctuation phenomenon, and it requires much time to obtain the maximum fluctuation amount F1 under many exposure conditions. The maximum fluctuation amount F1 differs for each exposure condition. In addition, it is difficult to completely grasp a thermal fluctuation phenomenon accompanying exposure.

Under the circumstances, an imaging characteristic fluctuation caused by lens heating is expressed by using a model formula, and the maximum fluctuation amounts F1 under a minimum number of exposure conditions are obtained at the time of examination to efficiently predict an imaging characteristic fluctuation for each exposure condition. In this case, the main controller 103 executes the prediction of an imaging characteristic fluctuation. The main controller 103 controls the illumination system controller 108, the reticle stage controller 130, the projection lens controller 114 (control unit), and the stage controller 120 based on the prediction result of an imaging characteristic fluctuation. At least, one of the illumination system controller 108, the reticle stage controller 130, the projection lens controller 114, and the stage controller 120 performs control using the prediction result obtained by the prediction unit to correct the imaging characteristic.

An imaging characteristic fluctuation is expressed by, for example, the following exponential model formula. The model formula is the composition of a plurality of functions representing time dependencies modeling imaging characteristic fluctuations. Each function $A_i(1-e^{-t/\tau i})$ has a dependency on an exposure angle of view. An exposure-angle-of-view dependency will foe described later with reference to equations (7) to (10).

$$F(t)=A_1(1-e^{-t/\tau 1})+A_2(1-e^{-t/\tau 2})+\ldots+A_i(1-e^{-t/\tau i}) \quad (4)$$

where i is a natural number, $\tau_i$ is a time constant, and $A_i$ is the amplitude of each exponential function. Each function is defined for each coefficient, (parameter) $\tau_i$ and each $A_i$, and equation (4) represents a common function. Since the right-hand side of equation (4) converges to $e^{-t/\tau i}=0$ with respect to t→∞, the maximum fluctuation amount F1 is given by $F1=A_1+A_2+\ldots+A_i$.

In order to cope with various exposure conditions, the model formula generally uses the time constant $\tau_i$ and the amplitude $A_i$ as functions of several exposure parameters, for example, a projection system numerical aperture NA, illumination system σ value, light intensity, exposure angle of view, reticle transmittance, and wafer reflectance.

If, however, for example, the time constant $\tau_i$ is used as a continuous variable with respect to the projection system numeral aperture NA, illumination system σ value, and exposure angle of view, it is necessary to countlessly add imaging characteristic predictions using different time constants every time these exposure conditions are changed. This is not preferable for the system.

For this reason, in general, the amplitude $A_i$ is expressed as a function of several exposure parameters, for example, the projection system numeral aperture NA, illumination system σ value, light intensity, exposure angle of view, reticle transmittance, and wafer reflectance by using a finite number of time constants $\tau_i$ for each projection system.

In addition, the number of exponential functions to be combined can be set to about 2 or 3 as an optimal number sufficient to achieve the required accuracy for the projection system. However, the spirit of the present invention is not limited to this example.

Figure 3A:
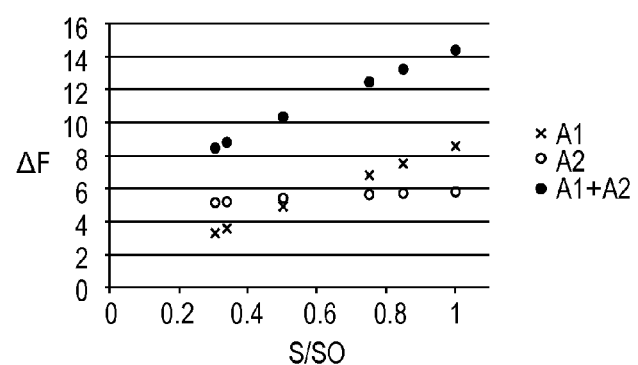
FIGS. 3A and 3B are graphs each showing an example of the prediction result of the imaging magnification fluctuation characteristic of the projection optical system.
Figure 3B:
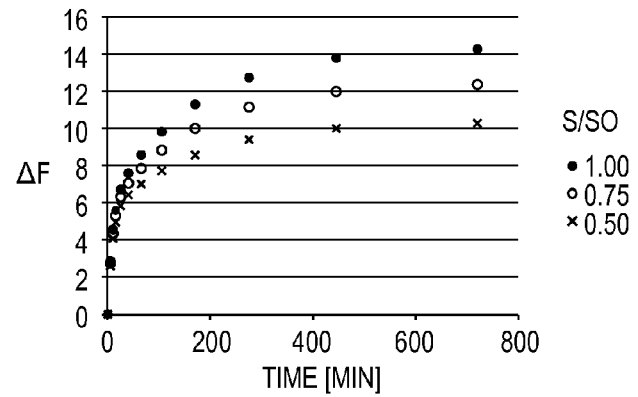

An imaging magnification will be exemplified as an imaging characteristic. FIGS. 3A and 3B show the relationship between imaging magnification fluctuation and exposure angle of view when, for example, an imaging magnification fluctuation is expressed by an exponential function model formula by using two time constants. The ordinate in each of FIGS. 3A and 3B represents deviations (imaging magnification fluctuations: ΔF) from an ideal imaging magnification, and time constants $\tau_1$ and $\tau_2$ are, for example, $\tau_1$=10000 sec and $\tau_2$=500 sec.

FIG. 3A shows an imaging magnification fluctuation (ΔF) with respect to an exposure-angle-of-view ratio (S/S0) for the coefficients ($A_1$ and $A_2$ in equation (4)) obtained by fitting using two time constants set in advance. Referring to FIG. 3A, "x", "○", and "•" respectively represent $A_1$, $A_2$, and $A_1+A_2$. The abscissa of FIG. 3A represents the ratio (exposure-angle-of-view ratio: S/S0) obtained by normalizing an exposure angle S of view with a maximum exposure angle S0 of view of the apparatus.

FIG. 3B is a graph plotting imaging magnification fluctuations (ΔF) at the respective exposure angles of view as a function of time. Note that this graph represents imaging magnification fluctuations at S/S0=1.0, 0.75, and 0.5 as typical exposure-angle-of-view ratios, but omits imaging magnification fluctuations at other exposure angles of view.

Referring to FIGS. 3A and 3B, assume that exposure conditions except for an exposure angle of view are constant conditions, including, for example, the projection optical system numeral aperture NA, illumination system σ value, light intensity (indicating, to be precise, a reticle irradiation energy per unit exposure area), reticle transmittance, and wafer reflectance.

At the time of examination of the projection optical system, $A_1$ and $A_2$ at the maximum exposure angle of view of the apparatus are obtained as $A0_1$ and $A0_2$, respectively. $A_1$ and $A_2$ at the time of a change in exposure angle of view are predicted by a model formula using parameters that change power entering the lens, such as an exposure angle of view, reticle transmittance, and wafer reflectance.

Assuming a proportional relationship with each parameter, $A_1$ and $A_2$ are represented by $$A_1 = A0_1 \cdot Tr \cdot (S/S0) \cdot I \cdot W_{refl} \quad (5)$$

$$A_2 = A0_2 \cdot Tr \cdot (S/S0) \cdot I \cdot W_{refl} \quad (6)$$

where I is an exposure intensity (W/m²), S is a set exposure angle of view (m²), S0 is a maximum exposure angle of view (m²), Tr is a reticle transmittance, $W_{refl}$ is a wafer reflectance, and $A0_1$ and $A0_2$ are coefficients calculated from the amount of imaging magnification fluctuation at the maximum exposure angle S0 of view.

Figure 4A:
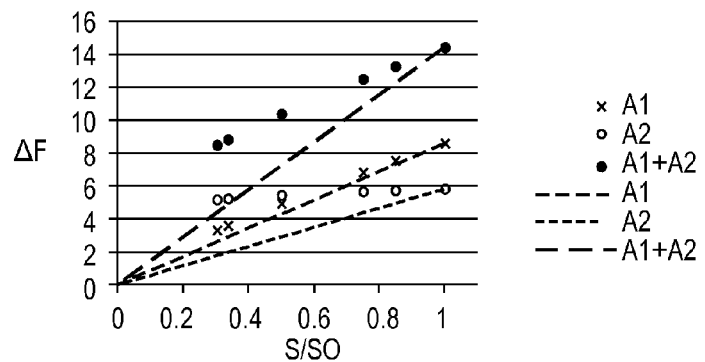
FIGS. 4A and 4B are graphs each showing an example of the prediction result of the imaging magnification fluctuation characteristic of the projection optical system.
Figure 4B:
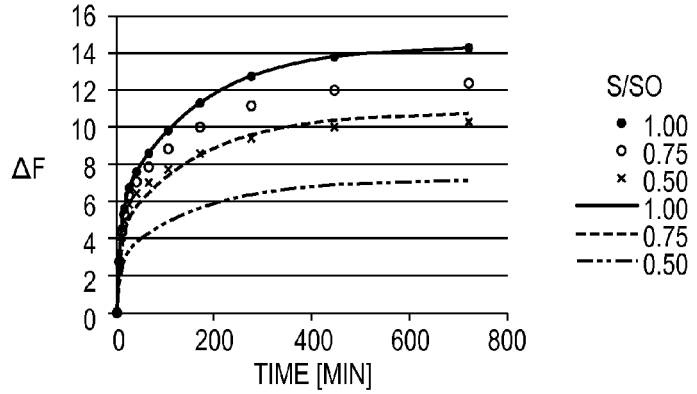

$A_1$ and $A_2$ at the time of a change in exposure angle of view are predicted in the manner shown in FIGS. 4A and 4B. The relationships between the ordinates and the abscissas in FIGS. 4A and 4B are the same as those in FIGS. 3A and 3B. FIG. 4B is a graph plotting imaging magnification fluctuations (ΔF) as a function of time by using the coefficients $A_1$ and $A_2$ in FIG. 4A. A fluctuation characteristic predicted value F(t) of an imaging magnification at the time of a change in exposure angle of view exhibits a predetermined difference from an actual imaging magnification fluctuation. If this difference does not satisfy the required accuracy of the projection system, $A_1$ and $A_2$ are respectively expressed as follows, assuming that the maximum exposure angle of view of the projection exposure system is S0 and proportional to the power of a ratio S/S0 of S0 to the set exposure angle S of view. In equations (7) and (8), the symbol "^" represents power computation.

$$A_1 = \mu_1 \cdot Tr \cdot (S/S0)^C \cdot I \cdot W_{refl} \quad (7)$$

$$A_2 = \mu_2 \cdot Tr \cdot (S/S0)^C \cdot I \cdot W_{refl} \quad (8)$$

In this case, a power exponent C is a constant, defining an exposure-angle-of-view ratio dependency, and is determined in advance for each system by simulations or from experimental results.

Figure 5A:
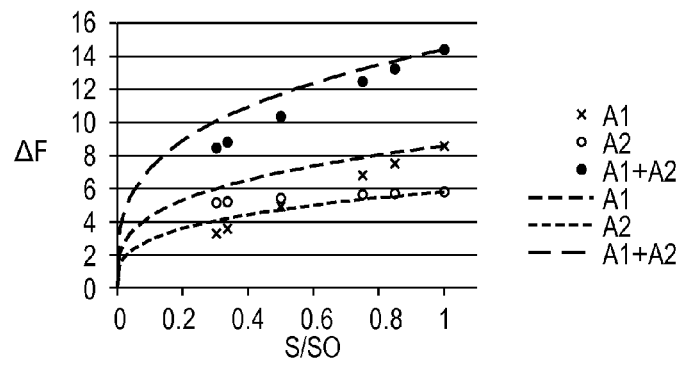
FIGS. 5A and 5B are graphs each showing an example of the prediction result of the imaging magnification fluctuation characteristic of the projection optical system.
Figure 5B:
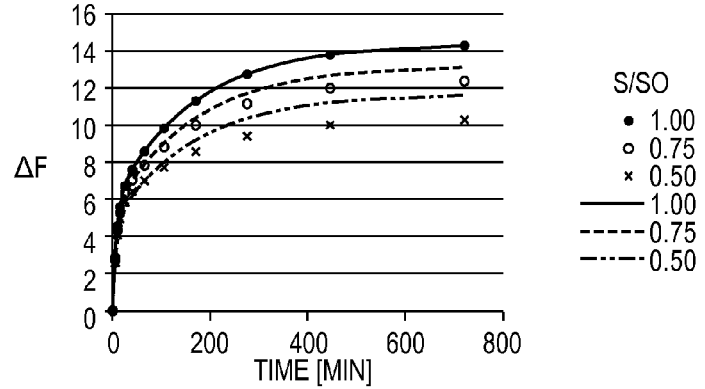

$A_1$ and $A_2$ at the time of a change in exposure angle of view are predicted in the manner shown in FIG. 5A. FIG. 5B is a graph plotting imaging magnification fluctuations as a function of time by using the coefficients $A_1$ and $A_2$. The relationships between the ordinates and the abscissas in FIGS. 5A and 5B are the same as those in FIGS. 3A and 3B. An imaging magnification predicted value at the time of a change in exposure angle of view can foe approximated to an actual imaging magnification fluctuation by modeling the imaging magnification predicted value at the time of a change in exposure angle of view with respect to an exposure angle of view by using a specific function.

Assume that the fluctuation predicted value F(t) of an imaging magnification at the time of a change in exposure angle of view exhibits a predetermined difference from an actual imaging magnification fluctuation and does not satisfy the required accuracy of the projection system in spite of the use of such a model formula. In this case, modeling is further performed upon adjustment of a constant C. For example, there is conceivable a method of approximating the fluctuation predicted value F(t) to the actual imaging magnification fluctuation by adjusting the constant C based on actual apparatus data.

For example, as shown in FIG. 3B, an imaging magnification fluctuation is obtained as a function of time by changing the exposure-angle-of-view ratio of the exposure angle S of view to the maximum exposure angle S0 of view of the projection exposure system from 1.0 to ¾ or ½. The coefficients $A_1$ and $A_2$ are then calculated from the obtained imaging magnification fluctuation and each exposure-angle-of-view ratio.

The constant C is determined from the obtained set of $A_1$ and $A_2$ so as to minimize the difference between the fluctuation predicted value F(t) of an imaging magnification and the actual imaging magnification fluctuation.

Figure 6A:
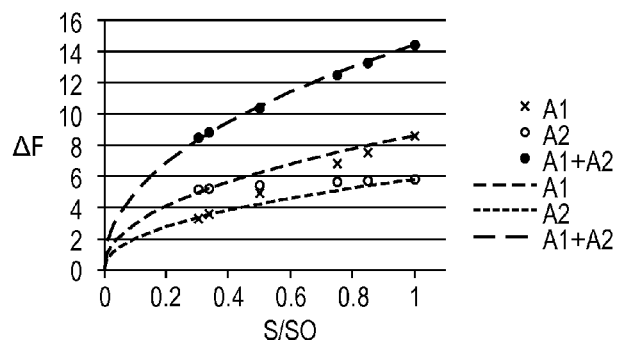
FIGS. 6A and 6B are graphs each showing an example of the prediction result of the imaging magnification fluctuation characteristic of the projection optical system.

Optimizing the constant C in this manner can further improve the prediction accuracy. $A_1$ and $A_2$ at the time of a change in exposure angle of view become the values shown in FIG. 6A.

Figure 6B:
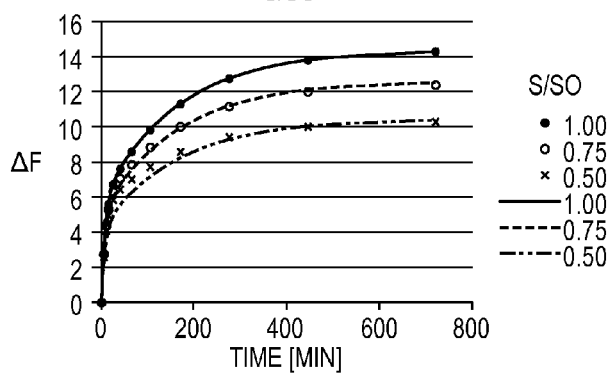

As shown in FIG. 6B, however, according to this model formula, the energy absorbed by the projection optical system to generate heat and the heat energy emitted by the projection optical system reach an equilibrium state. Even if a state in which an imaging magnification is stable can be accurately predicted, it is sometime impossible to accurately predict a state in which an imaging magnification greatly changes on the way from the start of exposure to an equilibrium state or on the way to an equilibrium state after the stop of exposure or a change in exposure condition.

In the embodiment of the present invention, therefore, a model formula for predicting an imaging magnification fluctuation is defined as follows. In equations (9) and (10), $C_1$ and $C_2$ are constants that define an exposure-angle-of-view ratio dependency and determined in advance for each system by simulations or from experimental results.

$$A_1 = \mu_1 \cdot Tr \cdot (S/S0)^{C_1} \cdot I \cdot W_{refl} \tag{9}$$

$$A_2 = \mu_2 \cdot Tr \cdot (S/S0)^{C_2} \cdot I \cdot W_{refl} \tag{10}$$

Figure 7A:
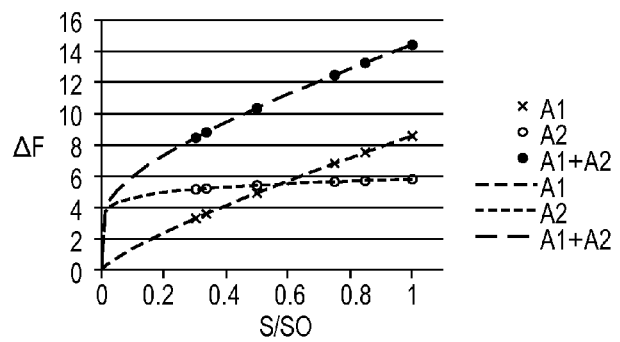
FIGS. 7A and 7B are graphs each showing an example of the prediction result of the imaging magnification fluctuation characteristic of the projection optical system.
Figure 7B:
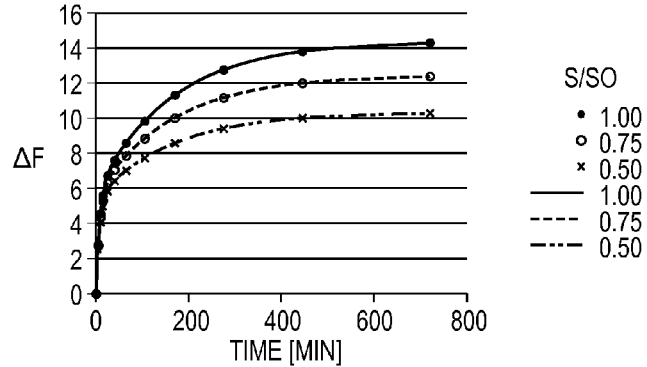

In this case, the power indices $C_1$ and $C_2$ are different constants defining an exposure-angle-of-view ratio dependency. $C_1$ and $C_2$ are determined in advance from experimental results. $A_1$ and $A_2$ at the time of a change in exposure angle of view are predicted in the manner shown in FIG. 7A. FIG. 7B is a graph plotting imaging magnification fluctuations as a function of time by using the coefficients $A_1$ and $A_2$. A model using the constants $C_1$ and $C_2$ defining an exposure-angle-of-view ratio dependency can accurately predict a state in which an imaging magnification is stable after the energy absorbed by the projection optical system to generate heat and the heat energy emitted by the projection optical system reach an equilibrium state. In addition, this model can accurately predict a state in which an imaging magnification greatly changes on the way from the start of exposure to an equilibrium state or on the way to an equilibrium state after the stop of exposure or a change in exposure condition.

According to the model formula represented by equations (9) and (10), it is possible to accurately predict an imaging magnification fluctuation and minimize errors.

The main controller 103 (prediction unit) predicts an imaging magnification fluctuation by using the above model formula. The main controller 103 controls the illumination system controller 108, the reticle stage controller 130, the projection lens controller 114, and the stage controller 120 based on the prediction result.

The illumination system controller 108, the reticle stage controller 130, the projection lens controller 114, and the stage controller 120 function as a correction unit which corrects an imaging magnification fluctuation based on the prediction result obtained by the prediction unit. The illumination system controller 108, the reticle stage controller 130, the projection lens controller 114, and the stage controller 120 can correct the imaging characteristic by performing control using the prediction result.

This embodiment has exemplified an imaging magnification fluctuation. Obviously, however, the projection optical system can exhibit an exposure-angle-of-view dependency different from that described above depending on the arrangement. In such a case, a model formula may be set, which has a set of optimal time constants and an angle-of-view dependency for each time constant.

In addition, this embodiment has exemplified an imaging magnification fluctuation. However, the embodiment can be applied to any imaging characteristic fluctuation caused by thermal action (ex. the absorption of heat and heat release) by a lens or a mirror upon exposure by a projection optical system, and can be applied to, for example, a focus, curvature of field, distortion, astigmatism aberration, and wavefront aberration.

In addition, this embodiment has exemplified the scanning exposure apparatus. However, the embodiment can be applied to a stepper exposure apparatus of the step & repeat scheme. The scanning exposure apparatus is generally configured to change an exposure angle of view based on the illumination size in the X direction and the scanning distance in the Y direction. If the illumination size in the Y direction does not fluctuate, there is no problem in reading a parameter which determines the incident area of exposure light on the projection optical system as the illumination size in the X direction.

Unlike in the scanning exposure apparatus, in the stepper type exposure apparatus, an imaging characteristic fluctuation does not simply depend on an exposure angle of view, and the imaging characteristic sometimes fluctuates depending on the sizes of a shot in the X and Y directions. In this case, for example, it is effective to set a model formula for a set of optimal time constants and an angle-of-view dependency corresponding to each time constant by using the sizes of a shot in the X and Y directions as parameters.

Second Embodiment

A method of manufacturing a device according to an embodiment of the present invention is suitable for manufacturing an element having a microstructure, such as a semiconductor device or liquid crystal display device. For example, a semiconductor device is manufactured through a pre-process of forming an integrated circuit on a wafer (substrate) and a post-process of completing, as a product, the integrated circuit chip on the wafer formed in the pre-process. The pre-process includes a step of exposing an image of a pattern on a mask onto a wafer coated with a photosensitive agent by illuminating the mask using the exposure apparatus, and a step of developing the wafer. The post-process includes an assembly step (dicing and bonding) and a packaging step (encapsulation).

For example, a liquid crystal display device is manufactured through a process of forming a transparent electrode. The process of forming a transparent electrode includes a step of applying a photosensitive agent to a glass substrate on which a transparent conductive film is deposited, a step of exposing the glass substrate coated with the photosensitive agent using the exposure apparatus described above, and a step of developing the glass substrate. The device manufacturing method in this embodiment is more advantageous than a conventional method in terms of at least one of the device performance, quality, productivity, and production cost.

Although the embodiments of the present invention have been described above, the present invention is not limited to these embodiments and can be variously modified and changed within the spirit and scope of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-168336, filed Aug. 13, 2013, which is hereby incorporated by reference herein in its entirety.

What is claimed is:

1. An exposure apparatus which projects an image of a pattern formed on a mask onto a substrate through a projection optical system, the apparatus comprising:
   a prediction unit configured to predict an imaging characteristic fluctuation of the projection optical system which is caused by thermal action due to exposure, by using a model formula modeling the imaging characteristic fluctuation; and
   a correction unit configured to correct the imaging characteristic based on a prediction result obtained by the prediction unit,
   wherein the model formula comprises a composition of a plurality of functions modeling the imaging characteristic fluctuation and indicating a time dependency, each of the plurality of functions having an exposure-angle-of-view dependency which represents a dependency of an illumination size, a size of an imaging plane at the wafer level or a mask area, and the exposure-angle-of-view dependencies of the plurality of functions being different from each other.

2. The apparatus according to claim 1, wherein each of the plurality of functions has a coefficient defined by a power of a ratio obtained by normalizing a set exposure angle of view with a maximum exposure angle of view of the projection optical system and the plurality of functions differ in a value of an exponent of the power from each other.

3. The apparatus according to claim 1, wherein the prediction unit predicts, as the imaging characteristic, at least one fluctuation of a focus, curvature of field, magnification, distortion, astigmatism aberration, and wavefront aberration of the projection optical system by using the model formula.

4. The apparatus according to claim 1, wherein the correction unit comprises a control unit configured to control a driving unit configured to control an aperture stop of the projection optical system and a driving unit configured to move an optical element of the projection optical system,
   wherein the control unit performs the control so as to correct the imaging characteristic by using a prediction result obtained by the prediction unit.

5. The apparatus according to claim 4, wherein the correction unit further comprises
   a mask stage control unit configured to control a position or angle of the mask by driving a mask stage holding the mask, and
   a substrate stage control unit configured to control a position or angle of the substrate by driving a substrate stage holding the substrate,
   wherein the mask stage control unit and the substrate stage control unit perform the control so as to correct the imaging characteristic by using a prediction result obtained by the prediction unit.

6. A method of manufacturing a device, the method comprising:
   a step of exposing a substrate by using an exposure apparatus; and
   a step of developing the exposed substrate,
   wherein the exposure apparatus projects an image of a pattern formed on a mask onto the substrate through a projection optical system, and
   the exposure apparatus includes:
   a prediction unit configured to predict an imaging characteristic fluctuation of the projection optical system which is caused by thermal action due to exposure, by using a model formula modeling the imaging characteristic fluctuation; and
   a correction unit configured to correct the imaging characteristic based on a prediction result obtained by the prediction unit,
   wherein the model formula comprises a composition of a plurality of functions modeling the imaging characteristic fluctuation and indicating a time dependency, each of the plurality of functions having an exposure-angle-of-view dependency which represents a dependency of an illumination size, a size of an imaging plane at the wafer level or a mask area, and the exposure-angle-of-view dependencies of the plurality of functions being different from each other.

* * * * *